United States Patent
Yang et al.

(10) Patent No.: US 9,536,759 B2
(45) Date of Patent: Jan. 3, 2017

(54) BAKING APPARATUS AND METHOD

(71) Applicant: Taiwan Semiconductor Manufacturing Co., Ltd, Hsin-Chu (TW)

(72) Inventors: Ching-Hai Yang, Taipei (TW); Shang-Sheng Li, Zhubei (TW); Yao-Hwan Kao, Baoshan Shiang (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/725,285

(22) Filed: May 29, 2015

(65) Prior Publication Data
US 2016/0351423 A1    Dec. 1, 2016

(51) Int. Cl.
*H01L 21/00*   (2006.01)
*H01L 21/67*   (2006.01)
*H01L 21/68*   (2006.01)
*H01L 21/687*  (2006.01)
*H01L 21/02*   (2006.01)

(52) U.S. Cl.
CPC ... *H01L 21/67115* (2013.01); *H01L 21/02005* (2013.01); *H01L 21/68* (2013.01); *H01L 21/687* (2013.01)

(58) Field of Classification Search
CPC .............. H01L 21/6715; H01L 21/6708; H01L 21/67259; H01L 21/68; H01L 21/67173; H01L 21/6719; B05D 1/005; B05D 3/0486; B05D 3/107; Y10S 134/902; Y10S 414/136; Y10S 430/136
See application file for complete search history.

(56) References Cited

U.S. PATENT DOCUMENTS

| | | | |
|---|---|---|---|
| 5,416,047 A * | 5/1995 | Konishi | H01L 21/6715 427/425 |
| 5,554,563 A | 9/1996 | Chu et al. | |
| 6,468,918 B1 | 10/2002 | Kuo | |
| 7,789,576 B2 | 9/2010 | Lee et al. | |
| 9,136,110 B2 | 9/2015 | Rathsack | |
| 2006/0097740 A1 * | 5/2006 | Howland, Jr. | G01R 31/312 324/750.03 |
| 2013/0052591 A1 | 2/2013 | Yang et al. | |

FOREIGN PATENT DOCUMENTS

TW    201506990 A    2/2015

OTHER PUBLICATIONS

U.S. Appl. No. 14/147,741, filed Jan. 6, 2014.

* cited by examiner

*Primary Examiner* — Robert Bachner
(74) *Attorney, Agent, or Firm* — McClure, Qualey & Rodack, LLP

(57) ABSTRACT

A baking apparatus for baking a wafer is provided. The baking apparatus includes a wafer chuck configured to hold the wafer, and a heating device disposed over the wafer chuck and configured to heat the wafer. The baking apparatus also includes a carrying arm configured to transport the wafer over the wafer chuck. The wafer chuck is in physical contact with the center area of the bottom surface of the wafer when the wafer is held by the wafer chuck.

20 Claims, 8 Drawing Sheets

BAKING APPARATUS AND METHOD

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a wafer, and patterning the various material layers using lithography process to form circuit components and elements thereon. Many integrated circuits are typically manufactured on a single wafer, and individual dies on the wafer are singulated by sawing between the integrated circuits along a scribe line. The individual dies are typically packaged separately, in multi-chip modules, or in other types of packaging, for example.

In the lithography process, a photoresist is applied to a wafer. A thin layer of the photoresist is spread on the surface of the wafer, and the photoresist is exposed and developed to form a pattern in the semiconductor manufacturing process. These developed patterns now have very fine detail, and some issues may cause unsatisfactory defects in the developed photoresist during the lithography process.

Although existing devices for a lithography apparatus have been generally adequate for their intended purposes, they have not been entirely satisfactory in all respects. Consequently, it would be desirable to provide a solution for improving the quality of the photoresist of the wafer during the lithography process.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1:
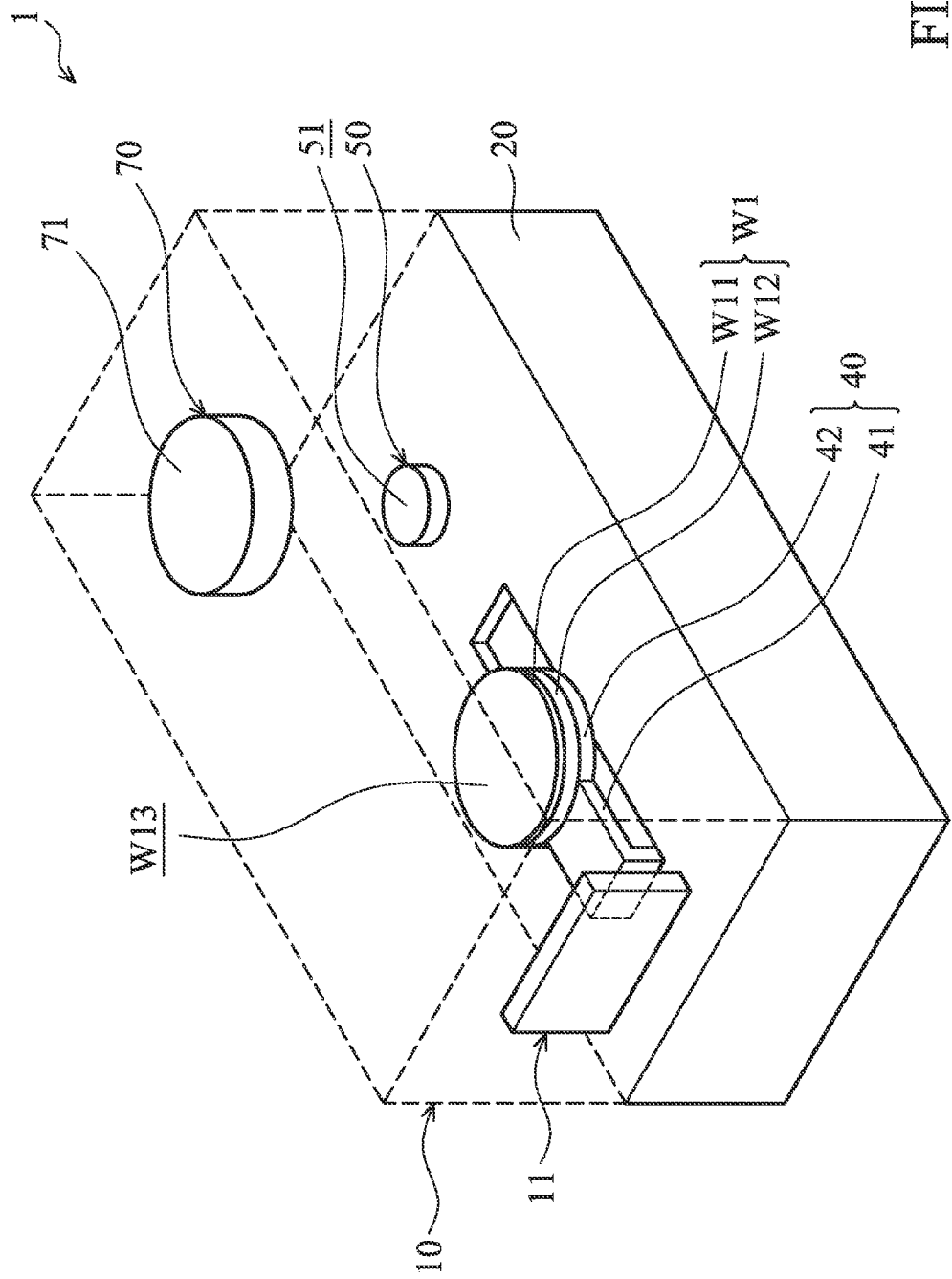
FIG. 1 is a perspective view of a baking apparatus in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

A baking apparatus and method are provided. In some embodiments, the baking apparatus is included in a semiconductor apparatus. The semiconductor apparatus is configured to perform a semiconductor manufacturing process on a wafer.

In some embodiments, the semiconductor apparatus is a lithography apparatus, and the semiconductor manufacturing process is a lithography process. The lithography apparatus is configured to perform the lithography process on a wafer. The lithography process is configured to transfer a circuit pattern onto a substrate by using a patterned mask and beam of light to selectively expose a photoresist layer. The lithography process may include photoresist coating, soft baking, mask aligning, exposing pattern, post-exposure baking, developing photoresist, hard baking and rinsing, other suitable processes, and combinations thereof.

In some embodiments, the semiconductor apparatus is a chemical mechanical polishing (CMP) apparatus, a physical vapor deposition (PVD) apparatus, a chemical vapor deposition (CVD) apparatus, an ion implant apparatus, an epitaxy apparatus, a sputter apparatus, a thermal processing apparatus, an etching apparatus, or another suitable apparatus.

In some embodiments, the semiconductor manufacturing process is a CMP process, a PVD process, a CVD process, an ALD process, a doping process, a screen printing process, a dry etching process, a wet etching process, or another suitable process.

Figure 2:
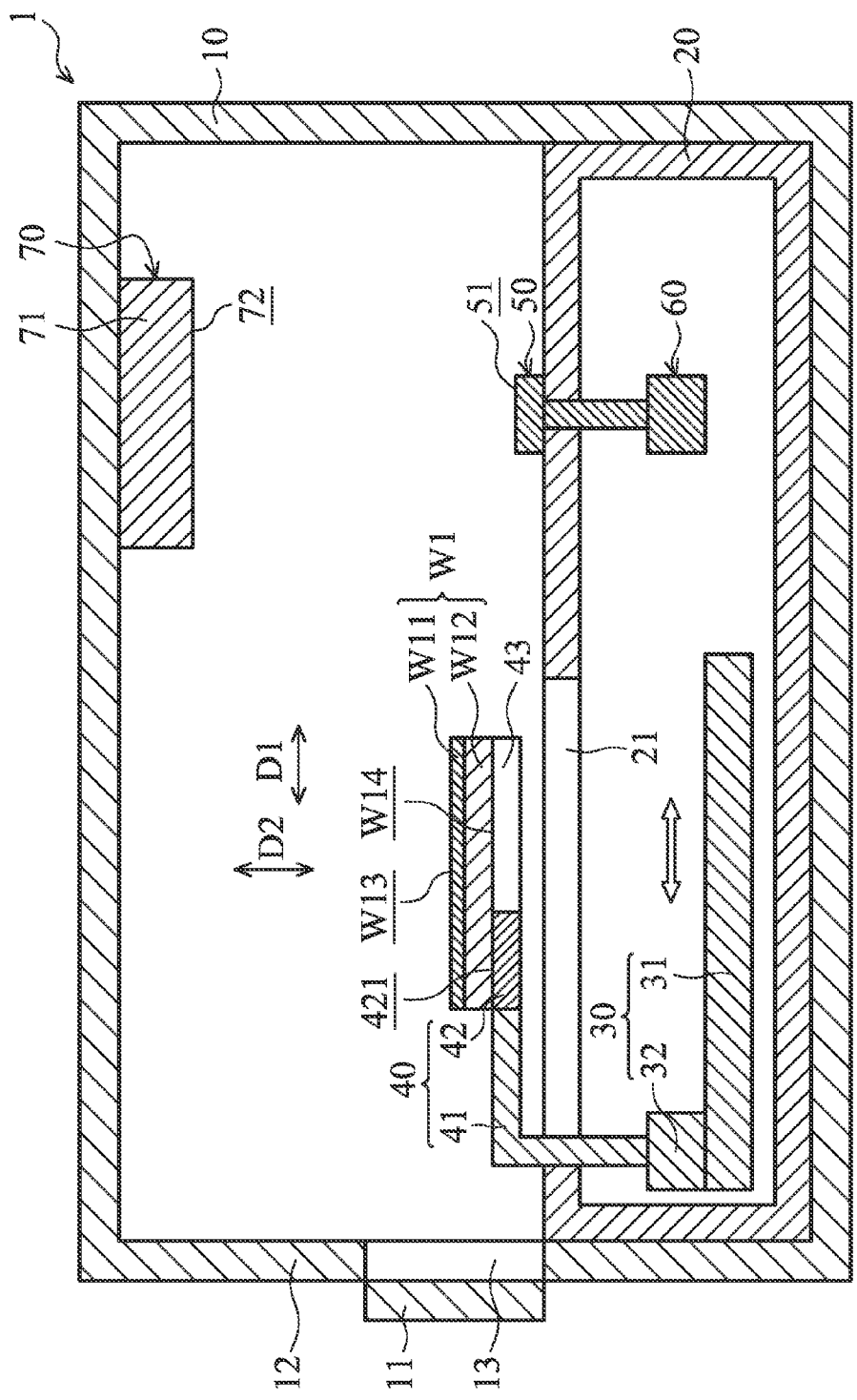
FIG. 2 is a schematic view of a baking apparatus in accordance with some embodiments of the disclosure.

FIG. 1 is a perspective view of a baking apparatus 1 in accordance with some embodiments of the disclosure. FIG. 2 is a schematic view of a baking apparatus 1 in accordance with some embodiments of the disclosure. The baking apparatus 1 is configured to perform a baking process on a wafer W1, such as soft baking, post-exposure baking, or hard baking. In some embodiments, the baking apparatus 1 is configured to bake the wafer W1 for a lithography process.

In some embodiments, the wafer W1 includes a photoresist W11 and a substrate W12. The photoresist W11 is coated on the substrate W12 by a coating process. In some embodiments, the photoresist W11 includes a positive photosensitive material or a negative photosensitive material. The photoresist W11 includes sensitizer, resin, and solvent.

In a soft baking process, for example, the baking process is used to decrease the solvent of the photoresist W11. Before the soft baking process, the photoresist W11 is not solidified. Therefore, the profile of the photoresist W11 is easily changed according the inclination of the substrate W12, and the particles are easily adhered to the photoresist W11.

The baking apparatus 1 includes a chamber 10, a support base 20, a moving mechanism 30, a carrying arm 40, a wafer chuck 50, an elevating mechanism 60, and a heating device 70. The chamber 10 includes a shutter 11 movably disposed on the side wall 12 of the chamber 10.

The shutter 11 is configured to cover a door opening 13 of the side wall 12. The door opening 13 is configured for the wafer W1 to pass through. In some embodiments, the shutter 11 is moved along the side wall 12 by sliding between an open position and a closed position. The door opening 13 is uncovered when the shutter 11 is located at the open position. The shutter 11 fully covers the door opening 13 when the shutter 11 is located at the closed position.

The support base 20 is disposed in the chamber 10. The moving mechanism 30 is disposed in the support base 20. The moving mechanism 30 is configured to move the carrying arm 40.

In some embodiments, the moving mechanism 30 includes a track 31 and an elevating element 32. The track 31 is extended along the moving direction D1. The elevating element 32 is movably disposed on the track 31, and configured to move along the track 31. The elevating element 32 is connected to the carrying arm 40, and configured to raise or descend the carrying arm 40 along the elevating direction D2. In some embodiments, the elevating direction D2 is perpendicular to the moving direction D1.

The carrying arm 40 is movably disposed on the support base 20, and connected to the elevating element 32. The carrying arm 40 is configured to transport the wafer W1. The carrying arm 40 is moved along the moving direction D1 or the elevating direction D2 by the moving mechanism 30.

In some embodiments, the carrying arm 40 is a cooling arm, configured to cool the wafer W1 after the wafer W1 is heated by the heating device 70. The carrying arm 40 includes a connecting stand 41 and a carrying plate 42. In some embodiments, the connecting stand 41 is an L-shaped structure. The connecting stand 41 is connected to the elevating element 32 and the carrying plate 42. In some embodiments, the connecting stand 41 passes through a guiding opening 21 of the support base 20.

The carrying plate 42 is configured to support the wafer W1. In some embodiments, the carrying plate 42 is a cooling plate, configured to cool the wafer W1 after the wafer W1 is heated by the heating device 70. Furthermore, the carrying plate 42 includes a slot 43 configured for the wafer chuck 50 or the elevating mechanism 60 to pass through. In some embodiments, the slot 43 extends from the center of the carrying plate 42 to the edge of the carrying plate 42 along the moving direction D1.

In some embodiments, the area of the carrying surface 421 of the carrying plate 42 corresponds to the areas of the top surface W13 and the bottom surface W14 of the wafer W1. The carrying surface 421 is the main surface of the carrying plate 42. The bottom surface W14 of the wafer W1 contacts the carrying surface 421 of the carrying plate 42 when the wafer W1 is supported by the carrying plate 42. The top surface W13 and the bottom surface W14 are the main surfaces of the wafer W1. The bottom surface W14 is opposite to the top surface W13.

In some embodiments, the carrying surface 421 of the carrying plate 42 is parallel to a horizontal plane. Therefore, the top surface W13 of the photoresist W11 is parallel to a horizontal plane since the photoresist W11 is not solidified before a baking process.

The wafer chuck 50 is disposed in the chamber 10, and disposed on the support base 20. The wafer chuck 50 is configured to hold the wafer W1. In some embodiments, the wafer chuck 50 is an electrostatic wafer chuck. The bottom surface W14 of the wafer W1 contacts the retaining surface 51 of the wafer chuck 50 when the wafer W1 is put onto or held by the wafer chuck 50.

In some embodiments, the each of the areas of the top surface W13 and the bottom surface W14 is in a range from about 130 cm^2 to about 707 cm^2. The area of the retaining surface 51 is in a range from about 18 cm^2 to about 135 cm^2. In some embodiments, the area of the bottom surface W14 (or the top surface W13) of the wafer W1 is about 1 times to about 36 times the area of the retaining surface 51 of the wafer chuck 50.

The retaining surface 51 is the main surface of the wafer chuck 50. In some embodiments, the retaining surface 51 is parallel to a horizontal plane. Therefore, the top surface W13 of the photoresist W11 is parallel to a horizontal plane since the photoresist W11 is not solidified before a baking process.

In some embodiments, the wafer chuck 50 contacts the center area Z1 of the bottom surface W14 of the wafer W1 when the wafer W1 is held by the wafer chuck 50. In some embodiments, the wafer chuck 50 contacts the center of the bottom surface W14 of the wafer W1 when the wafer W1 is held by the wafer chuck 50.

The elevating mechanism 60 is disposed in the support base 20. The elevating mechanism 60 is configured to raise or descend the wafer chuck 50 along the elevating direction D2. The elevating mechanism 60 is also configured to rotate the wafer chuck 50 to make the wafer W1 rotate.

The heating device 70 is disposed over the wafer chuck 50. The heating device 70 is configured to heat the wafer W1. In some embodiments, the heating device 70 is an electromagnetic heater, an infrared heater, or a resistance heater. In some embodiments, the heating device 70 includes a heating plate 71. The heating plate 71 is parallel to the wafer chuck 50. In some embodiments, the heating plate 71 is a metal plate or a ceramic plate.

The heating plate 71 has a heating surface 72 facing the retaining surface 51 of the wafer chuck 50. The area of the heating surface 72 is greater than or equal to the top surface W13 of the wafer W1. The heating surface 72 is parallel to the retaining surface 51. In some embodiments, the heating surface 72 is parallel to the top surface W13 of the wafer W1 (or the retaining surface 51 of the wafer chuck 50). Therefore, the photoresist W11 is heated uniformly by the heating plate 71.

Figure 3:
FIG. 3 is a flow chart of a baking method in accordance with some embodiments of the disclosure.

FIG. 3 is a flow chart of a baking method in accordance with some embodiments of the disclosure. FIGS. 4A to 4E are schematic views of a baking apparatus 1 during an intermediate stage of the baking method in accordance with some embodiments of the disclosure. In step S101, the wafer W1 is put onto the carrying plate 42 of the carrying arm 40 as shown in FIG. 1. The carrying plate 42 is located at a cooling position adjacent to or contacting to the support base 20.

In some embodiments, the shutter 11 is located at the open position. The wafer W1 is transported into the chamber 10 via the door opening 13, and is put onto the carrying plate 42 by a transport arm (not shown in figures). The shutter 11 is located at the closed position to cover the door opening 13 after the wafer W1 is put onto the carrying plate 42.

When the wafer W1 is put onto the carrying plate 42, the bottom surface W14 of the wafer W1 contacts the carrying surface 421 of the carrying plate 42, and the bottom surface W14 of wafer W1 is parallel to a horizontal plane. Therefore, the top surface W13 of the photoresist W11 is parallel to a horizontal plane, and the thickness of the photoresist W11 is uniform.

Figure 4A:
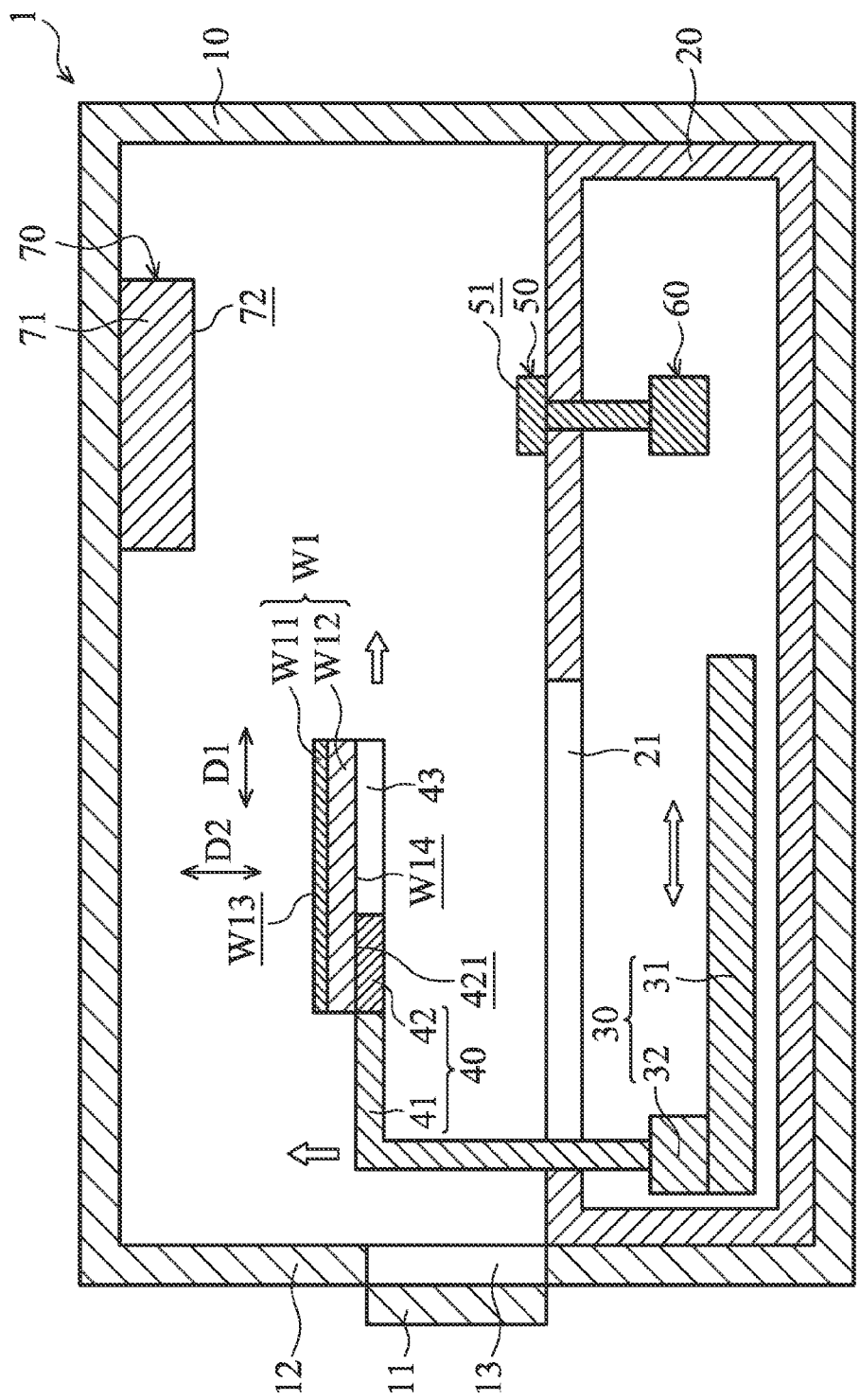
FIGS. 4A to 4E are schematic views of a baking apparatus during an intermediate stage of the baking method in accordance with some embodiments of the disclosure.

In step S103, the wafer W1 is transported over the wafer chuck 50 by the carrying arm 40. As shown in FIG. 4A, the carrying plate 42 with the wafer W1 is raised by the elevating element 32 along the elevating direction D2. In some embodiments, the carrying plate 42 is raised by the elevating element 32 along the elevating direction D2 before the wafer W1 is put onto the wafer chuck 50.

Figure 4B:
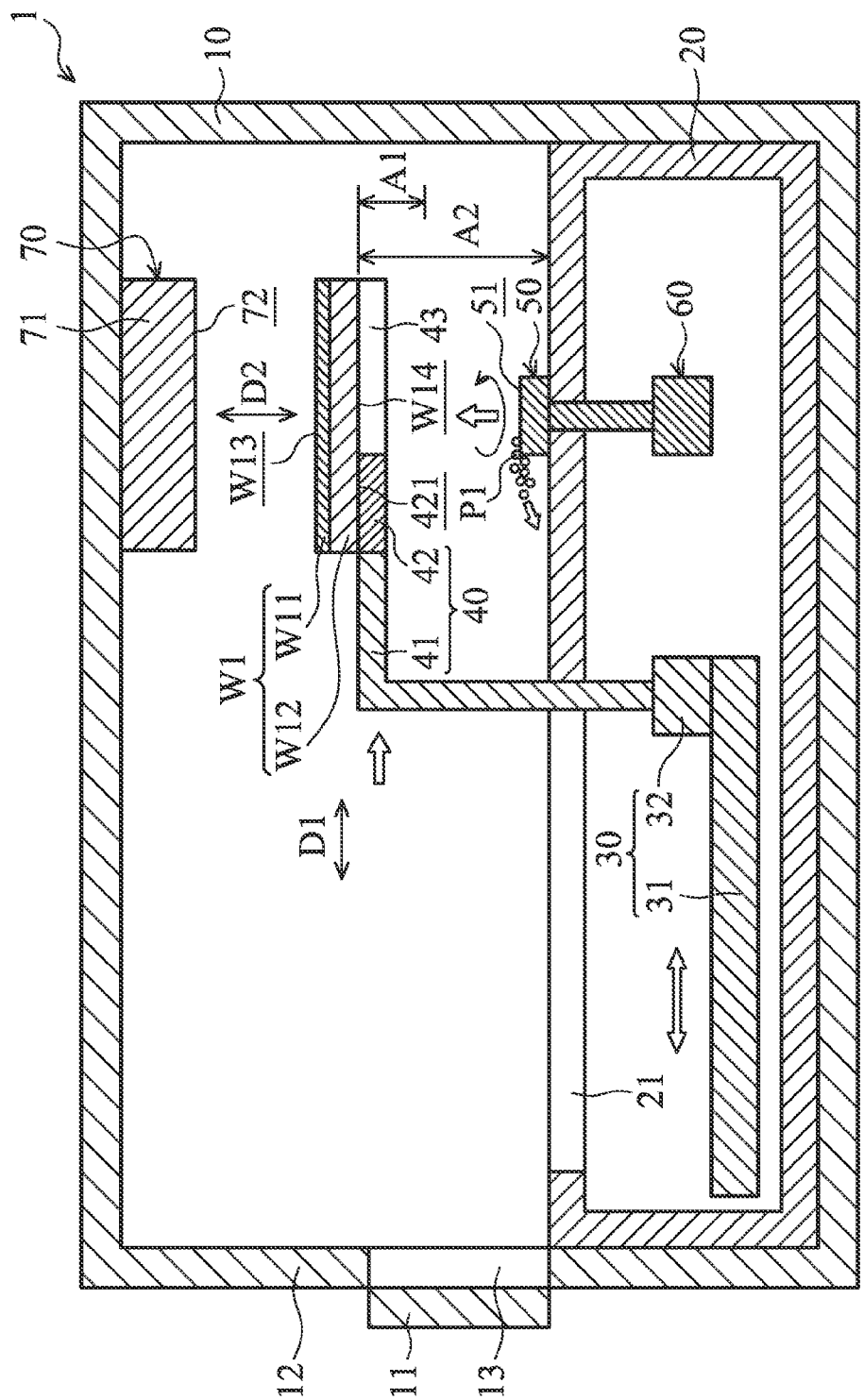

Afterwards, the carrying plate 42 with the wafer W1 is moved along the moving direction D1 by the moving mechanism 30 until the wafer W1 is located over the wafer chuck 50, as shown in FIG. 4B. The carrying plate 42 and the wafer W1 are between the wafer chuck 50 and the heating device 70 when the wafer W1 is located over the wafer chuck 50.

As shown in FIG. 4B, the wafer chuck 50 is located at an initial position adjacent to the support base 20. In step S105, the wafer chuck 50 is rotated by the elevating mechanism 60 before the wafer W1 is put onto the wafer chuck 50. In some embodiments, the wafer chuck 50 is rotated before the wafer W1 is transported into the chamber 10. In some embodiments, the wafer chuck 50 is rotated before the wafer W1 is put onto the wafer chuck 50. In some embodiments, the rotation speed of the wafer chuck 50 is in a range from about 5 rpm to about 4500 rpm.

In some embodiments, some particles P1 fall onto the retaining surface 51 of the wafer chuck 50. If there are particles P1 between the wafer W1 and the retaining surface 51 when the wafer chuck 50 is put onto the wafer chuck 50, the wafer W1 is inclined to a horizontal plane. The top surface W13 of the photoresist W11 will be inclined to the bottom surface W14 of the wafer W1 after the baking process. Therefore, the thickness of the photoresist W11 is not uniform, and the profile of the photoresist W11 is caused after the baking process due to the particles between the wafer W1 and the retaining surface 51 when the wafer chuck 50 is put onto the wafer chuck 50.

When the wafer chuck 50 is rotated, the wafer chuck 50 provides a centrifugal force to the particles P1 on the retaining surface 51, and thus the particles are removed from the retaining surface 51 by the retaining surface 51. There are no particles between the wafer W1 and the retaining surface 51 of the wafer chuck 50. Therefore, the top surface W13 of the photoresist W11 is parallel to the bottom surface W14 of the wafer W1 after a baking process, and the thickness of the photoresist W11 is uniform.

The wafer chuck 50 stops rotating before the carrying plate 42 is located over the wafer chuck 50. In some embodiments, the wafer chuck 50 stops rotating before the wafer chuck 50 contacts the wafer W1. In some embodiments, the wafer chuck 50 stops rotating after a predetermined time. In some embodiments, the predetermined time is in a range from about 1 second to about 10 seconds.

Figure 4C:
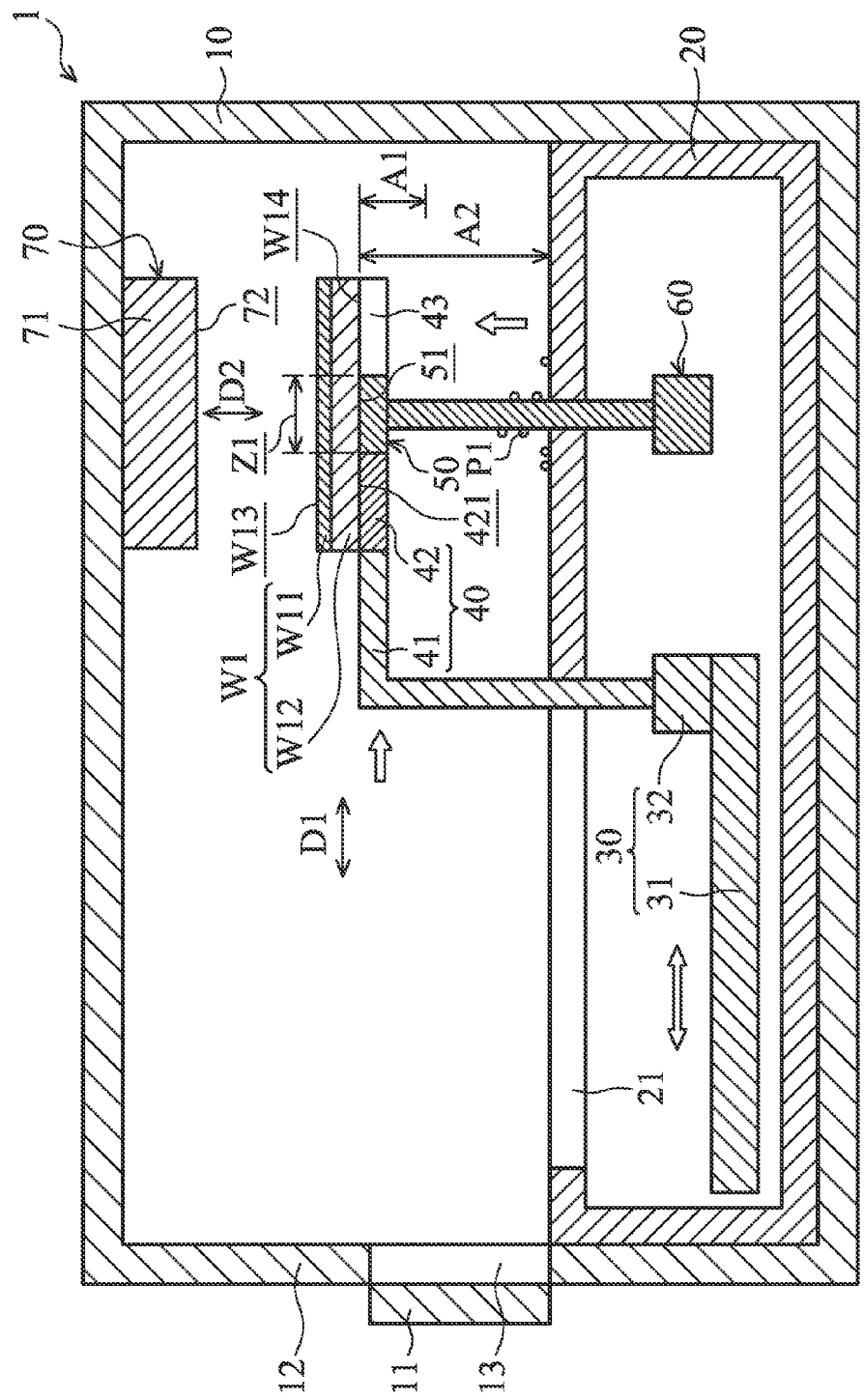

In step S107, the wafer W1 is put onto the wafer chuck 50 by raising the wafer chuck 50. After the wafer chuck 50 stops rotating, the wafer chuck 50 is raised by the elevating mechanism 60 along the elevating direction D2 toward a contacting position, as shown in FIG. 4C. The wafer chuck 50 contacts the wafer W1 supported on the carrying plate 42 in the contacting position.

If the wafer chuck 50 is raised by pins (not shown in figures), the bottom surface W14 of the wafer chuck 50 may be scratched by the pins (the area of the end of the pin may be in a range from about 1 mm^2 to about 49 mm^2). The wafer W1 may be inclined when the wafer W1 is disposed on a wafer chuck 50 in subsequent processes due to the scratching of the bottom surface W14, and thus the yield rate of the wafer W1 is decreased.

The rising speed of the wafer chuck 50 is decreased when the wafer chuck 50 is close to the wafer W1 in the contacting position. The area of the bottom surface W14 of the wafer W1 is about 1 times to about 36 times the area of the retaining surface 51 of the wafer chuck 50. Therefore, the bottom surface W14 of wafer W1 may not be scratched by the wafer chuck 50, and the yield rate of the wafer W1 is increased.

In some embodiments, the average rising speed of the wafer chuck 50 when it is far from the wafer W1 over a predetermined distance A1 relative to the wafer W1 in the contacting position is about 6 times to about 50 times the average rising speed of the wafer chuck 50 within the predetermined distance A1 relative to the wafer W1. The average rising speed of the wafer chuck 50 when it is far from the wafer W1 over the predetermined distance A1 is in a range from about 30 mm/s to about 50 mm/s. The average rising speed of the wafer chuck 50 within the predetermined distance A1 is in a range from about 1 mm/s to about 5 mm/s.

Moreover, in some embodiments, the distance A2 between the support base 20 and the carrying plate 42 in the contacting position is in a range from about 30 mm to about 80 mm. The predetermined distance A1 is in a range from about 1 mm to about 5 mm. The distance A2 is about 6 times to about 50 times the predetermined distance A1. Therefore, the time it takes for the wafer chuck 50 to be moved from the initial position to contact the wafer W1 in the contacting position is decreased, and thus the time required for the baking process is decreased.

Afterwards, the wafer chuck 50 is raised to the contacting position that puts it in physical contact with the center area Z1 after the wafer W1 is located over the wafer chuck 50. As shown in FIG. 4C, the wafer chuck 50 passes through the slot 43 of the carrying plate 42 to contact the center area Z1 of the bottom surface W14 of the wafer W1 in the contacting position.

Afterwards, the wafer chuck 50 holds the wafer W1. As shown in FIG. 4C, the wafer W1 is located between the heating device 70 and the wafer chuck 50 when the wafer W1 is held by the wafer chuck 50.

The heating plate 71 is located over the wafer chuck 50 and the wafer chuck 50 contacts the wafer W1 in the contacting position far from the support base 20. Therefore, the particles P1 on the support base 20 (or on the elevating mechanism 60 adjacent to the support base 20) should not fall on the top surface W13 of the wafer W1 in the contacting position.

In some embodiments, the carrying arm 40 is moved back into the cooling position after the wafer W1 is held by the wafer chuck 50. In some embodiments, the carrying arm 40 is not moved after the wafer W1 is held by the wafer chuck 50. The carrying arm 40 is moved when the wafer W1 is put onto the carrying arm 40 again after the wafer W1 is heated by the heating device 70.

Figure 4D:
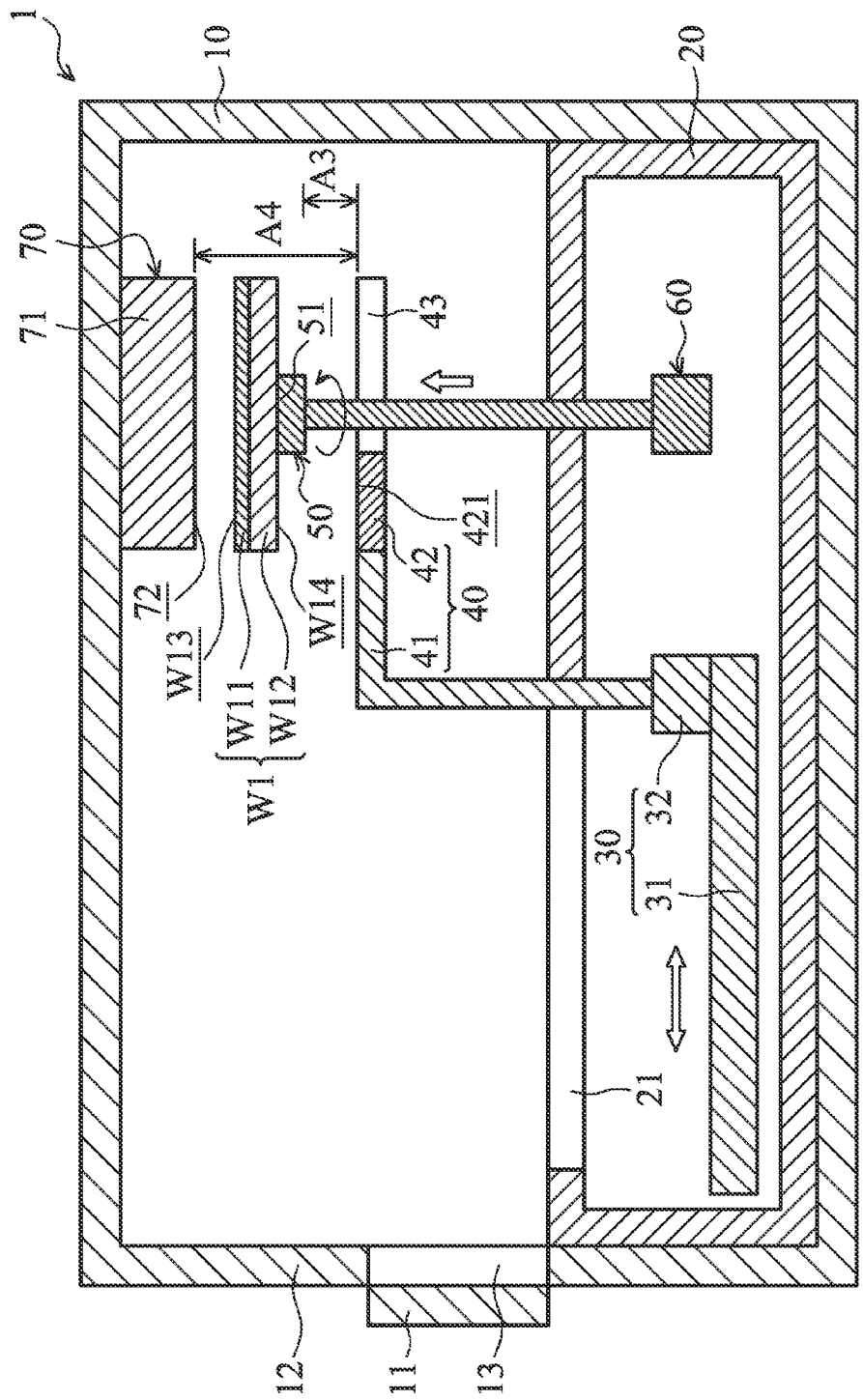

In step S109, the wafer W1 is raised to a heating position that is close to the heating device 70 by the wafer chuck 50 after the wafer W1 is held on the wafer chuck 50, as shown in FIG. 4D. In some embodiments, the carrying arm 40 is moved back into the cooling position after the wafer W1 is raised into the heating position.

In some embodiments, the carrying arm 40 is not moved after the wafer W1 is raised to the heating position that is close to the heating device 70, and the carrying arm 40 is moved again when the wafer W1 is put onto the carrying arm 40 again after the wafer W1 is heated by the heating device 70.

In step S111, the wafer W1 is heated by the heating plate 71 in a heating position. As shown in FIG. 4D, the wafer W1 is located between the heating device 70 and the wafer chuck 50 when the wafer W1 is heated by the heating plate 71 of the heating device 70.

In some embodiments, the heating device 70 has a heating temperature in a range from about 70° C. to about 250° C. In some embodiments, the distance A2 between the heating position and the heating plate 71 is in a range from about 30 mm to about 80 mm. The solvent of the photoresist W11 is decreased by the heat from the heating plate 71. Since the particles on the retaining surface 51 of the wafer chuck 50 are removed, the top surface W13 of the photoresist W11 is parallel to a horizontal plane and the bottom surface W14 of the wafer W11. The thickness of the photoresist W11 is uniform after the wafer W1 is heated by the heating plate 71.

In some embodiments, the wafer W1 is rotated by the wafer chuck 50 when the wafer W1 is heated by the heating device 70. In some embodiments, the rotation speed of the wafer chuck 50 is in a range from about 5 rpm to about 100 rpm when the wafer W1 is heated by the heating device 70. Therefore, the temperature profile and the thickness of the photoresist W11 are uniform by the rotation of the wafer W1 when the wafer W1 is heated by the heating device 70.

In some embodiments, the wafer W1 is heated by the heating plate 71 by contact with the heating surface 72 of the heating plate 71. The rising speed of the wafer chuck 50 is decreased when the wafer chuck 50 is close to the heating plate 71.

In some embodiments, the average rising speed of the wafer chuck 50 when it is far from the heating plate 71 over a predetermined distance relative to the heating plate 71 is about 6 times to about 30 times the average rising speed of the wafer chuck 50 within the predetermined distance. The average rising speed of the wafer chuck 50 when it is far from the heating plate 71 over the predetermined distance is in a range from about 0.5 mm/s to about 3 mm/s. The average rising speed of the wafer chuck 50 within the predetermined distance is in a range from about 0.1 mm/s to about 1.5 mm/s. Therefore, the time it takes for the wafer chuck 50 to move from the contacting position to the heating position is decreased, and thus the time required for the baking process is decreased.

Figure 4E:
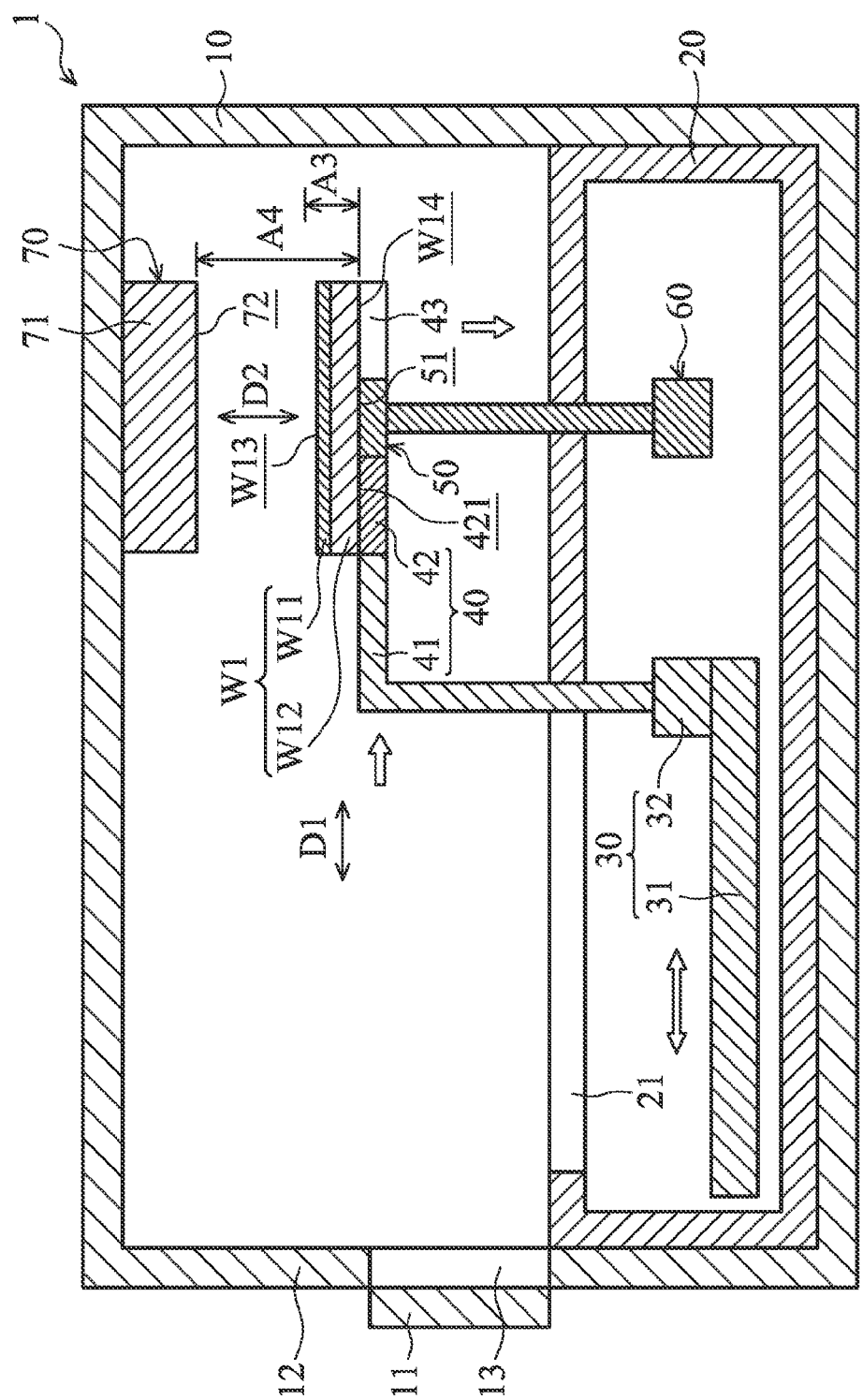

In step S113, the wafer W1 is descended by the wafer chuck 50 so that the wafer W1 is brought into contact with the carrying arm 40 after the wafer W1 is heated by the heating plate 71 as shown in FIGS. 4D and 4E. The carrying plate 42 is moved into the contacting position or located under the heating plate 71 and the wafer chuck 50 before the wafer W1 is descended by the wafer chuck 50 from the heating position.

In some embodiments, the average descending speed of the wafer chuck 50 when it is far from the carrying plate 42 over a predetermined distance A3 relative to the carrying plate 42 in the contacting position is about 1 times to about 25 times the average descending speed of the wafer chuck 50 within the predetermined distance A3. The average descending speed of the wafer chuck 50 when it is far from the carrying plate 42 over the predetermined distance A1 is in a range from about 1.5 mm/s to about 2.5 mm/s. The average descending speed of the wafer chuck 50 within the predetermined distance A3 is in a range from about 0.1 mm/s to about 1.5 mm/s.

Moreover, in some embodiments, the distance A4 between the heating plate 71 and the carrying plate 42 in the contacting position is in a range from about 30 mm to about 50 mm. In some embodiments, the predetermined distance A3 is in a range from about 1 mm to about 5 mm. The distance A4 is about 6 times to about 50 times the predetermined distance A3. Therefore, the time it takes for the wafer W1 to be put onto the carrying plate 42 in the contacting position from the heating position is decreased.

In some embodiments, the wafer chuck 50 is continually descended into the initial position by the elevating mechanism 60 after the wafer W1 contacts the carrying plate 42.

In step S115, the wafer W1 is transported from the wafer chuck 50 into the cooling position by the carrying arm 40 as shown in FIG. 2. The wafer W1 stays on the carrying plate 42 for a cooling period at the cooling position. In some embodiments, the cooling period is in range from about 20 seconds to about 60 seconds.

In some embodiments, the wafer W1 is cooled to an ambient temperature for a subsequence semiconductor manufacturing process. In some embodiments, the ambient temperature is in a range from about 13° C. to about 32° C.

Embodiments of a baking apparatus and method are provided. The baking apparatus is configured to bake a wafer for a lithography process. Particles that have fallen on the wafer are decreased since a heating device of the baking apparatus is located over the wafer. The wafer is held by a wafer chuck to prevent the bottom surface of the wafer from being scratched, and the yield rate of the wafer is increased.

Moreover, the wafer is rotated by the wafer chuck when the wafer is heated by the heating device, and thus the temperature profile and the thickness of the photoresist are uniform. In addition, the wafer chuck is rotated before the wafer is put onto the wafer chuck, and thus the particles fallen on the wafer chuck can be removed.

In some embodiments, a baking apparatus for baking a wafer is provided. The baking apparatus includes a wafer chuck configured to hold the wafer, and a heating device disposed over the wafer chuck and configured to heat the wafer. The baking apparatus also includes a carrying arm configured to transport the wafer over the wafer chuck. The wafer chuck contacts the center area of the bottom surface of the wafer when the wafer is held by the wafer chuck.

In some embodiments, a baking apparatus for baking a wafer is provided. The baking apparatus includes a wafer chuck configured to hold the wafer, and a heating device disposed over the wafer chuck and configured to heat the wafer. The wafer is rotated by the wafer chuck when the wafer is heated by the heating device.

In some embodiments, a baking method for baking a wafer is provided. The baking method includes transporting the wafer over a wafer chuck by a carrying arm, and putting the wafer on the wafer chuck by raising the wafer chuck. The baking method also includes raising the wafer to close to a heating device by the wafer chuck, and heating the wafer by the heating device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A baking apparatus for baking a wafer, comprising:
a chamber defining an interior and having an opening for providing access to the interior;
a support base disposed within the interior, the support base having a support surface and a guiding opening extending along the support surface;
a wafer chuck configured to hold the wafer, the wafer chuck being disposed within the interior and configured to move between a retracted position adjacent the support base and an extended position displaced from the support base;
a heating device, disposed within the interior and over the wafer chuck, configured to heat the wafer; and
a carrying arm disposed within the interior and configured to transport the wafer over the wafer chuck, the carrying arm having a slot sized and shaped to receive the wafer chuck, the carrying arm extending through the guiding opening of the support surface and being movable from a baking transfer position adjacent the opening of the chamber to a chuck transfer position aligned over the wafer chuck,
wherein, for baking the wafer, the carry arm is configured to move along the guiding opening and transport the wafer from the baking transfer position to the chuck transfer position, at which the wafer chuck moves toward the extended position to engage through the slot of the guiding arm to contact a bottom surface of the wafer such that the wafer is held by the wafer chuck, beneath the heating device, and is no longer carried by the carry arm.

2. The baking apparatus as claimed in claim 1, wherein the wafer chuck is raised to a contacting position in which it is in contact with a center area after the wafer is located over the wafer chuck, and the wafer is raised to a heating position that is close to the heating device by the wafer chuck after the wafer is held on the wafer chuck.

3. The baking apparatus as claimed in claim 1, wherein the wafer is located between the heating device and the wafer chuck when the wafer is held by the wafer chuck.

4. The baking apparatus as claimed in claim 1, wherein the wafer is rotated by the wafer chuck when the wafer is heated by the heating device.

5. The baking apparatus as claimed in claim 1, wherein the wafer chuck is rotated before the wafer is put onto the wafer chuck.

6. The baking apparatus as claimed in claim 1, wherein an average rising speed of the wafer chuck when the wafer chuck is far from the wafer over a predetermined distance relative to the wafer is about 6 times to about 50 times an average rising speed of the wafer chuck within the predetermined distance, wherein the predetermined distance is in a range from about 1 mm to about 5 mm.

7. The baking apparatus as claimed in claim 1, wherein an area of the bottom surface of the wafer is about 1 times to about 36 times an area of a retaining surface of the wafer chuck, wherein the retaining surface contacts the bottom surface when the wafer is held by the wafer chuck.

8. The baking apparatus as claimed in claim 1, wherein the heating device has a heating surface facing a retaining surface of the wafer chuck, and an area of the heating surface is greater than or equal to a top surface of the wafer.

9. The baking apparatus as claimed in claim 1, wherein the heating device has a heating temperature in a range from about 70° C. to about 250° C.

10. A baking apparatus for baking a wafer, comprising:
a chamber defining an interior and having an opening for providing access to the interior;
a support base disposed within the interior, the support base having a support surface and a guiding opening extending along the support surface;
a wafer chuck configured to hold the wafer, the wafer chuck being disposed within the interior and configured to move between a retracted position adjacent the support base and an extended position displaced from the support base;
a heating device, disposed within the interior and over the wafer chuck, configured to heat the wafer; and
a carrying arm disposed within the interior and configured to transport the wafer over the wafer chuck, the carrying arm having a slot sized and shaped to receive the wafer chuck, the carrying arm extending through the guiding opening of the support surface and being movable from a baking transfer position adjacent the opening of the chamber to a chuck transfer position aligned over the wafer chuck,
wherein, for baking the wafer, the carry arm is configured to move along the guiding opening and transport the wafer from the baking transfer position to the chuck transfer position, at which the wafer chuck moves toward the extended position to engage through the slot of the guiding arm to contact a bottom surface of the wafer such that the wafer is held by the wafer chuck, beneath the heating device, and is no longer carried by the carry arm,
wherein the wafer is rotated by the wafer chuck when the wafer is heated by the heating device.

11. The baking apparatus as claimed in claim 10, wherein the wafer is located between the heating device and the wafer chuck when the wafer is held by the wafer chuck.

12. The baking apparatus as claimed in claim 10, wherein the wafer chuck contacts a center area of a bottom surface of the wafer when the wafer is held by the wafer chuck.

13. The baking apparatus as claimed in claim 10, wherein the wafer chuck is rotated before the wafer is put onto the wafer chuck.

14. The baking apparatus as claimed in claim 10, wherein an area of the bottom surface of the wafer is about 1 times to about 36 times an area of a retaining surface of the wafer chuck, wherein the retaining surface contacts the bottom surface when the wafer is held by the wafer chuck.

15. The baking apparatus as claimed in claim 10, wherein the heating device has a heating surface facing a retaining surface of the wafer chuck, and an area of the heating surface is greater than or equal to a top surface of the wafer.

16. The baking apparatus as claimed in claim 1, wherein the wafer is descended by the wafer chuck to make the wafer contact the carrying arm after the wafer is heated by the heating device.

17. The baking apparatus as claimed in claim 1, wherein the wafer comprises a substrate and a photoresist coated on the substrate, and the photoresist faces the heating device when the wafer is held by the wafer chuck.

18. The baking apparatus as claimed in claim 10, wherein the wafer chuck is raised to a contacting position in which it is in contact with an center area of the bottom surface of the wafer after the wafer is located over the wafer chuck, and the wafer is raised to a heating position that is close to the heating device by the wafer chuck after the wafer is held on the wafer chuck.

19. The baking apparatus as claimed in claim 10, wherein an average rising speed of the wafer chuck when the wafer chuck is far from the wafer over a predetermined distance relative to the wafer is about 6 times to about 50 times an average rising speed of the wafer chuck within the predetermined distance, wherein the predetermined distance is in a range from about 1 mm to about 5 mm.

20. The baking apparatus as claimed in claim 10, wherein the heating device has a heating temperature in a range from about 70° C. to about 250° C.

* * * * *